(12) United States Patent
Hsieh et al.

(10) Patent No.: US 10,224,455 B2
(45) Date of Patent: Mar. 5, 2019

(54) LIGHT EMITTING DEVICE AND METHOD OF FORMING THE SAME

(71) Applicant: EPISTAR CORPORATION, Hsinchu (TW)

(72) Inventors: Min-Hsun Hsieh, Hsinchu (TW); Chih-Chiang Lu, Hsinchu (TW); Ching-Pu Tai, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 409 days.

(21) Appl. No.: 14/100,999

(22) Filed: Dec. 9, 2013

(65) Prior Publication Data

US 2014/0096901 A1 Apr. 10, 2014

Related U.S. Application Data

(60) Continuation-in-part of application No. 13/730,130, filed on Dec. 28, 2012, now Pat. No. 8,932,885, (Continued)

(30) Foreign Application Priority Data

Jun. 27, 2001 (TW) .............................. 90115871 A
Jan. 27, 2006 (TW) .............................. 95103659 A (51) Int. Cl.
*H01L 21/00* (2006.01)
*H01L 33/00* (2010.01)
(Continued)

(52) U.S. Cl.
CPC ........ *H01L 33/005* (2013.01); *H01L 33/0079* (2013.01); *H01L 33/10* (2013.01);
(Continued)

(58) Field of Classification Search
CPC ... H01L 33/0079; H01L 33/10; H01L 33/005; H01L 33/42; H05B 33/26; Y10T 29/49995; Y10T 156/1062
(Continued)

(56) References Cited

U.S. PATENT DOCUMENTS 6,465,809 B1 * 10/2002 Furukawa ........... H01L 33/0079
257/94
6,559,482 B1 * 5/2003 Sheu .................... H01L 29/7371
257/197
(Continued)

FOREIGN PATENT DOCUMENTS

CN 1368764 9/2002
CN 1549356 11/2004
(Continued)

*Primary Examiner* — Ovidio Escalante
(74) *Attorney, Agent, or Firm* — Muncy, Geissler, Olds & Lowe, P.C.

(57) ABSTRACT

A light-emitting device includes a transparent substrate, a transparent adhesive layer on the transparent substrate, a first transparent conductive layer on the transparent adhesive layer, a multi-layer epitaxial structure and a first electrode on the transparent conductive layer, and a second electrode on the multi-layer epitaxial structure. The multi-layer epitaxial structure includes a light-emitting layer. The transparent substrate has a first surface facing the transparent adhesive layer and a second surface opposite to the first surface, wherein the area of the second surface is larger than that of the light-emitting layer, and the area ratio thereof is not less than 1.6.

17 Claims, 8 Drawing Sheets

Related U.S. Application Data which is a division of application No. 13/114,384, filed on May 24, 2011, now Pat. No. 8,344,353, application No. 14/100,999, which is a division of application No. 12/717,558, filed on Mar. 4, 2010, now Pat. No. 8,602,832, said application No. 13/114,384 is a continuation of application No. 11/724,310, filed on Mar. 15, 2007, now Pat. No. Re. 42,422, which is an application for the reissue of Pat. No. 6,867,426, said application No. 12/717,558 is a division of application No. 11/626,742, filed on Jan. 24, 2007.

(51) Int. Cl.
*H01L 33/10* (2010.01)
*H05B 33/26* (2006.01)
*H01L 33/42* (2010.01)

(52) U.S. Cl.
CPC ............ *H05B 33/26* (2013.01); *H01L 33/42* (2013.01); *Y10T 29/49995* (2015.01); *Y10T 156/1062* (2015.01)

(58) Field of Classification Search
USPC ........................................ 445/24; 438/29, 33
See application file for complete search history.

(56) References Cited

U.S. PATENT DOCUMENTS

| | | | |
|---|---|---|---|
| 6,897,488 B2 | 5/2005 | Baur et al. | |
| 7,132,691 B1* | 11/2006 | Tanabe | B82Y 20/00 257/103 |
| 2002/0024055 A1 | 2/2002 | Uemura et al. | |
| 2002/0105003 A1 | 8/2002 | Yang et al. | |
| 2002/0123164 A1* | 9/2002 | Slater, Jr. | H01L 33/20 257/98 |
| 2002/0125485 A1 | 9/2002 | Steigerwald et al. | |
| 2002/0185648 A1 | 12/2002 | Furukawa et al. | |
| 2003/0155579 A1* | 8/2003 | Yang | H01L 33/64 257/88 |
| 2003/0189212 A1* | 10/2003 | Yoo | H01L 33/0079 257/79 |
| 2003/0213969 A1 | 11/2003 | Wang et al. | |
| 2004/0036078 A1* | 2/2004 | Kondo | H01L 21/6835 257/80 |
| 2004/0051109 A1* | 3/2004 | Ishizaki | H01L 33/26 257/89 |
| 2004/0119084 A1 | 6/2004 | Hsieh et al. | |
| 2004/0182434 A1* | 9/2004 | Hashimoto | H01L 31/0322 257/E31.027 |
| 2004/0251828 A1 | 12/2004 | Tsukamoto et al. | |
| 2006/0231852 A1* | 10/2006 | Kususe | H01L 24/06 257/99 |
| 2007/0120141 A1* | 5/2007 | Moustakas | B82Y 20/00 257/103 |
| 2008/0061307 A1* | 3/2008 | Ikeda | H01L 33/22 257/94 |
| 2008/0315176 A1* | 12/2008 | Takeuchi | H01L 33/02 257/13 |
| 2009/0278148 A1* | 11/2009 | Nabekura | H01L 33/20 257/98 |
| 2009/0283028 A1* | 11/2009 | Schowalter | H01L 21/02389 117/9 |
| 2010/0084679 A1* | 4/2010 | Hsieh | H01L 33/22 257/98 |
| 2013/0292639 A1* | 11/2013 | Emerson | H01L 33/14 257/13 |
| 2015/0236192 A1* | 8/2015 | Yoo | H01L 33/0025 257/13 |

FOREIGN PATENT DOCUMENTS

| | | |
|---|---|---|
| CN | 1614794 | 5/2005 |
| JP | 11-168239 | 6/1999 |
| JP | 2005142278 | 6/2005 |
| TW | 231054 | 4/2005 |

* cited by examiner

LIGHT EMITTING DEVICE AND METHOD OF FORMING THE SAME

CROSS REFERENCE TO RELATED APPLICATION

This application is a divisional of U.S. patent application Ser. No. 11/626,742, filed on Jan. 24, 2007, entitled "LIGHT EMITTING DEVICE AND METHOD OF FORMING THE SAME," which claims priority to Taiwan Patent Application No. 095103659, entitled "LIGHT EMITTING DEVICE AND METHOD OF FORMING THE SAME", filed on Jan. 27, 2006, the contents of which are hereby incorporated by reference.

TECHNICAL FIELD

The present invention relates to a light-emitting device, and more particularly to a light-emitting device having a multi-layer epitaxial structure and a method of forming the same.

BACKGROUND

Light-emitting diodes have different light-emitting principles and structures from conventional light sources and advantage of small volume and high reliability, hence they can have versatile applications. For example, light-emitting diodes may form a variety of large-scale components on demand to apply to indoor or outdoor displays. Therefore, the brightness enhancement is always an important issue in the manufacture of light-emitting diodes.

Figure 1A:
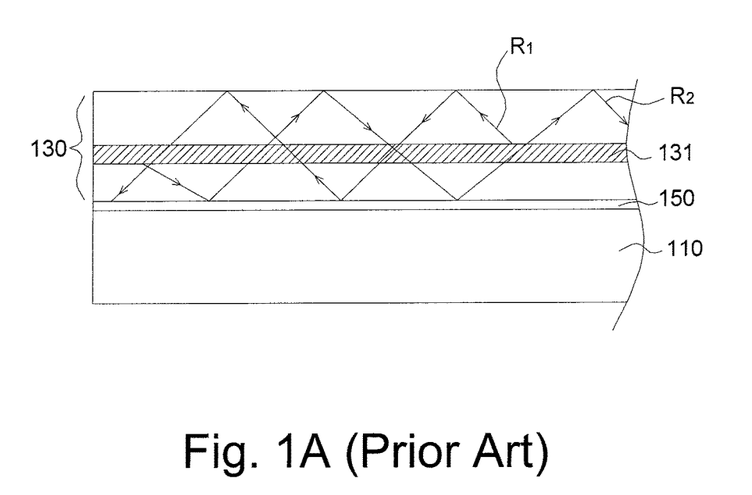
FIGS. 1A-1B are schematic diagrams of conventional light emitting diodes.
Figure 1B:
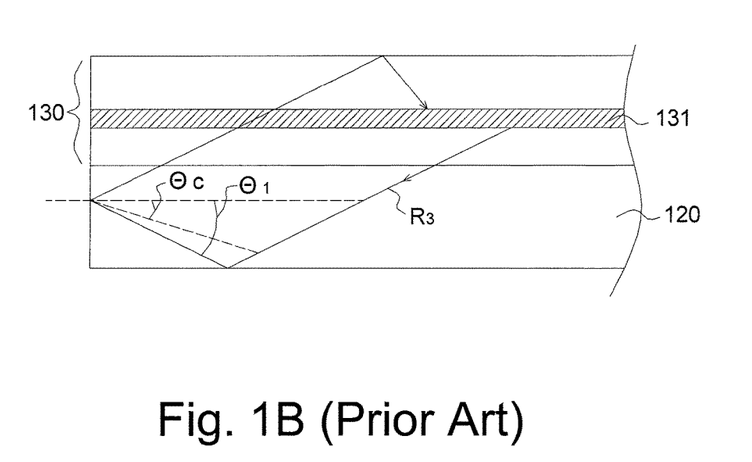

FIG. 1A is a schematic diagram of a conventional light-emitting diode. As shown in FIG. 1A, the light-emitting diode includes a substrate 110, a multi-layer epitaxial structure 130 having a light-emitting layer 131 on the substrate 110, and a reflective layer 150 between the multi-layer epitaxial structure 130 and the substrate 110. The reflective layer 150 is configured to reflect the light downward from the light-emitting layer 131 back above the light-emitting layer 131. However, the light beams with larger incident angles, such as light $R_1$ and light $R_2$, would be gradually absorbed by the light-emitting layer 131 after passing back and forth through the light-emitting layer 131 due to the total internal reflection, and consequently the brightness and the luminous efficiency of the light-emitting diode would be reduced. FIG. 1B is a schematic diagram of another conventional light-emitting diode. As shown in FIG. 1B, the light-emitting diode includes a transparent substrate 120 and a multi-layer epitaxial structure 130 having a light-emitting layer 131. When the light from the light-emitting layer 131 is reflected at the bottom of the transparent substrate 120 and travels to the sides of the transparent substrate 120, some light beams (such as light $R_3$) would be reflected back inside the light-emitting diode because its incident angle $\theta_1$ is larger than the critical angle $\theta_c$, and have more chances of being absorbed by the light-emitting layer 131. Therefore the brightness and the luminous efficiency of the light-emitting diode are reduced.

Consequently, it is necessary to provide a light-emitting diode and a method of forming the same capable of reducing the times the light passing through the light-emitting layer.

SUMMARY OF THE INVENTION

The present invention provides a light-emitting device having a transparent adhesive layer, including a transparent substrate capable of improving the brightness and a first and a second electrodes on the same side.

In one embodiment, the present invention provides a light-emitting device including a transparent substrate, a transparent adhesive layer on the transparent substrate, a multi-layer epitaxial structure on the transparent adhesive layer, the multi-layer epitaxial structure including a light-emitting layer, a first electrode on the transparent adhesive layer, and a second electrode on the multi-layer epitaxial structure. The transparent substrate has a first surface facing the transparent adhesive layer and a second surface opposite to the first surface, and the ratio of the area of the second surface to the area of the light-emitting layer is not less than 1.6.

In another embodiment, the present invention provides a light-emitting device including a transparent substrate, a transparent adhesive layer on the transparent substrate, a multi-layer epitaxial structure on the transparent adhesive layer, a first electrode on the transparent adhesive layer, and a second electrode on the multi-layer epitaxial structure, wherein the transparent substrate has a first surface contacting the transparent adhesive layer and a second surface opposite to the first surface, and the area of the second surface is larger than that of the first surface.

The present invention further provides a method of forming a light-emitting device. The multi-layer epitaxial structure is attached to the transparent substrate through the transparent adhesive layer and then diced to obtain light-emitting devices with improved brightness.

In one embodiment, the method includes a step of providing a temporary substrate having a multi-layer epitaxial structure and a first transparent conductive layer formed on the temporary substrate, and a step of cutting the temporary substrate to form a first die, the first dice including a portion of the multi-layer epitaxial structure, a portion of the first transparent conductive layer, and a portion of the temporary substrate. The method also includes the step of providing a transparent substrate having a transparent adhesive layer formed on the transparent substrate, and a step of attaching the first die on the transparent adhesive layer. The transparent substrate is then cut to form a second die, the second die includes at least one of the first die, a portion of the transparent adhesive layer, and a portion of the transparent substrate. The transparent substrate of the second die has a first surface contacting the transparent adhesive layer and a second surface opposite to the first surface, and the ratio of the area of the second surface to that of a light-emitting layer of the multi-layer epitaxial structure is not less than 1.6.

In another embodiment, the method includes the step of providing a transparent substrate having a light-emitting element on the transparent substrate. The light-emitting element includes a transparent adhesive layer on the transparent substrate, a multi-layer epitaxial structure on the transparent adhesive layer, a first electrode on the transparent adhesive layer, and a second electrode on the multi-layer epitaxial structure. The transparent substrate is then cut to make the ratio of the area of a second surface of the transparent substrate distant from the transparent adhesive layer to the area of a light-emitting layer of the multi-layer epitaxial structure is not less than 1.6.

DETAILED DESCRIPTION OF THE PREFERRED EMBODIMENTS

The preferred embodiments of the present invention would be illustrated with reference to the appended drawings. It should be noticed that, to present this invention clearly, the layers and elements in the drawings are not depicted to scale, and the known components, materials, and processing techniques would be omitted below to avoid obscuring the teachings of the present invention.

Figure 2A:
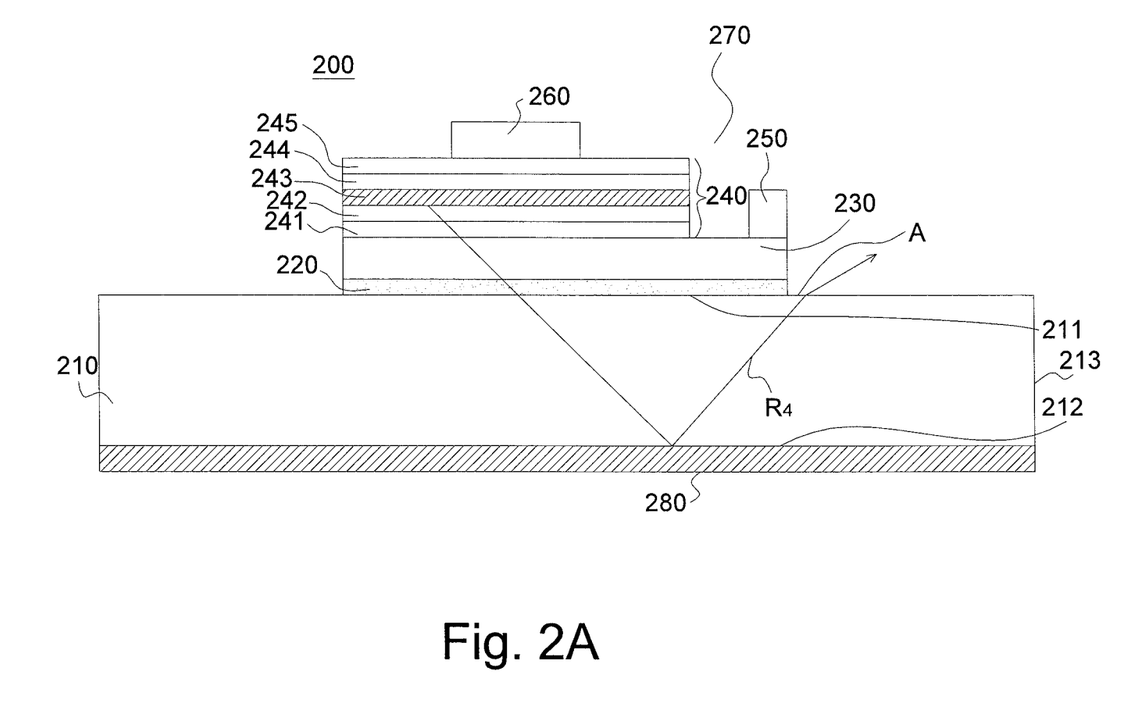
FIGS. 2A-2C are schematic diagrams of light emitting devices according to the present invention.
Figure 2B:
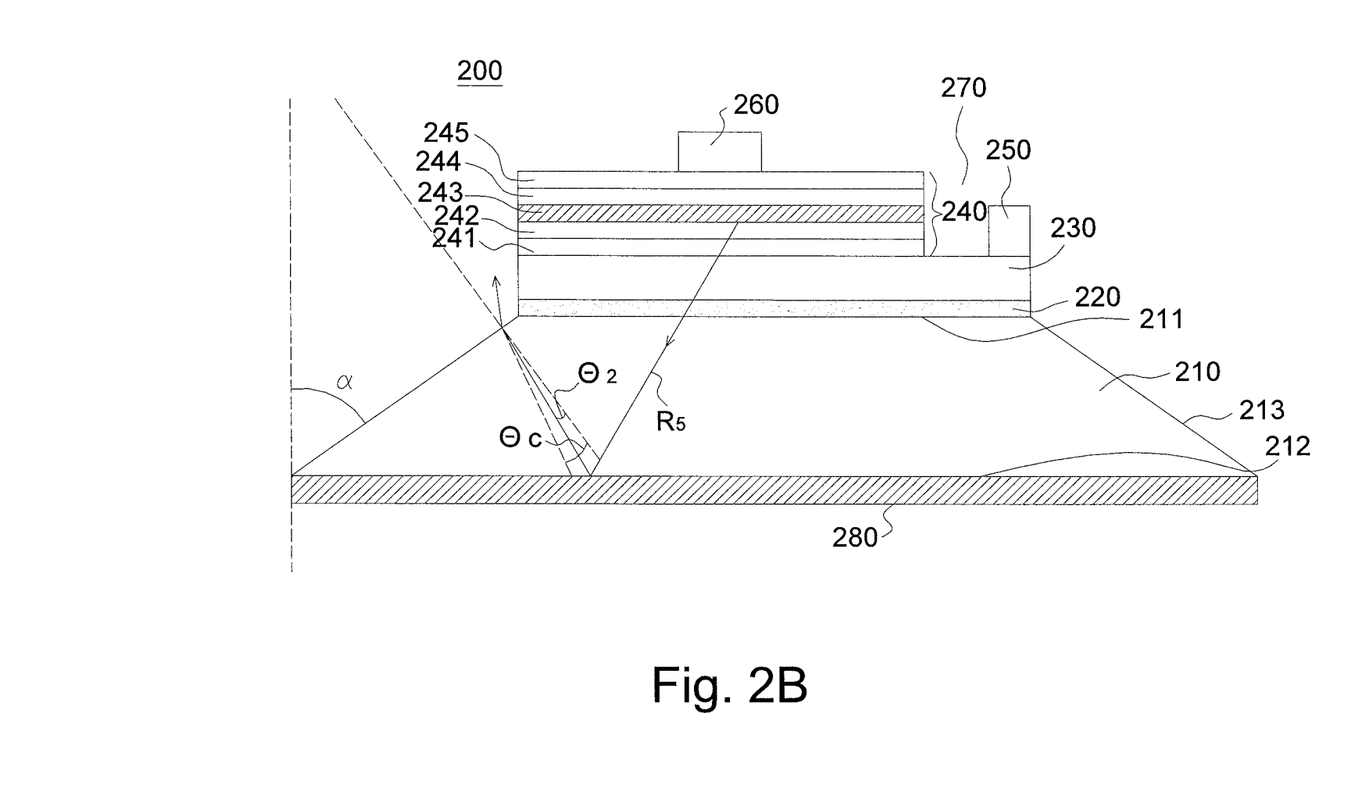
Figure 2C:
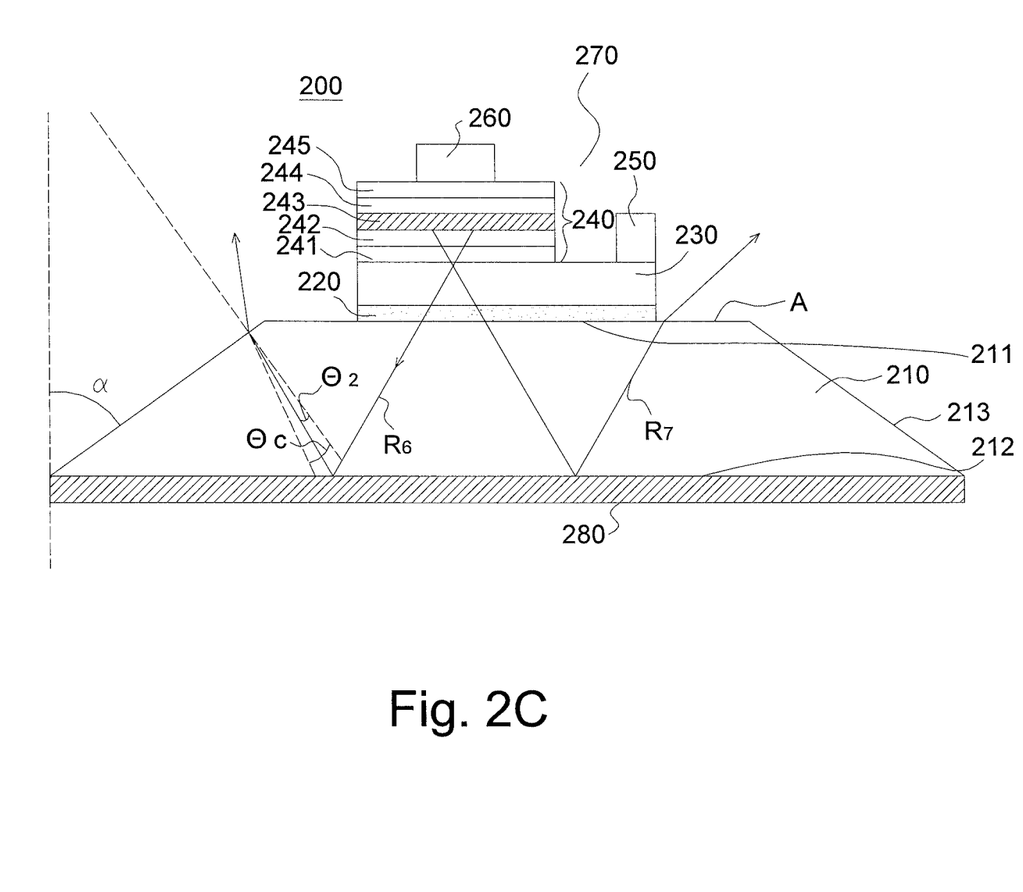

FIGS. 2A-2C show preferred embodiments of the present invention. A light-emitting device 200 according to the present invention includes a transparent substrate 210, a transparent adhesive layer 220 on the transparent substrate 210, and a first transparent conductive layer 230 on the transparent adhesive layer 220. The material of the transparent substrate 210 includes but not limited to glass, sapphire, SiC, GaP, GaAsP, and ZnSe. The transparent adhesive layer 220 can have a material including but not limited to spin-on glasses, silicone, Benzocyclobutene (BCB), Epoxy, polyimide, and Perfluorocyclobutane (PFCB). The first transparent conductive layer 230 can be made of a material including but not limited to indium tin oxide, cadmium tin oxide, zinc oxide, and zinc tin oxide.

Moreover, as shown in FIGS. 2A-2C, the light-emitting device 200 according to the present invention further includes a multi-layer epitaxial structure 240 and a first electrode 250 on the first transparent conductive layer 230, and a second electrode 260 on the multi-layer epitaxial structure 240. A trench 270 may be optionally formed between the first electrode 250 and the multi-layer epitaxial structure 240. The multi-layer epitaxial structure 240 includes a first contact layer 241, a first confinement layer 242, a light-emitting layer 243, a second confinement layer 244, and a second contact layer 245. To form a good ohmic contact with the second electrode 260, a second transparent conductive layer 261 capable of spreading currents may be optionally formed between the second electrode 260 and the second contact layer 245. The second transparent conductive layer 261 can be made of a material including but not limited to indium tin oxide, cadmium tin oxide, zinc oxide, and zinc tin oxide. The first contact layer 241 and the second contact layer 245 can be independently made of materials including but not limited to GaP, GaAs, and GaAsP. The first confinement layer 242, the first light-emitting layer 243, and the second confinement layer 244 can be made of materials including AlGaInP. The first electrode 250 and the second electrode 260 can be respectively made of a material including but not limited to Au, Al, Pt, Cr, and Ti. In the structures shown in FIGS. 2A-2C, the transparent substrate 210 has a first surface 211 contacting with the transparent adhesive layer 220 and a second surface 212 opposite to the first surface 211. However, it should be noticed that, the area of the second surface 212 is larger than that of the light-emitting layer 243.

In the exemplary embodiment of FIG. 2A, the area of the second surface 212 is larger than that of the light-emitting layer 243. As shown in FIG. 2A, the second surface 212 of the transparent substrate has an area essentially equal to that of the first surface 211, and the areas of the first surface 211 and the second surface 212 are larger than the area of the light-emitting layer 243. Therefore, the first surface 211 of the transparent substrate would form an exposed portion, "A", not covered with the light-emitting layer 243. The exposed portion, "A", should at least not be covered with the light-emitting layer 243. For example, the exposed portion, "A", in the figure is not covered with the multi-layer epitaxial structure 240, the first transparent conductive layer 230, and the transparent adhesive layer 220. The size of the exposed portion "A" can be decided upon the area ratio of the first surface 211 to the light-emitting layer 243, the second surface 212 to the light-emitting layer 243, or both of them, and a preferred area ratio is not less than 1.6. The structure having the exposed portion, "A", can increase the brightness of the light-emitting device 200. As shown in FIG. 2A, the light $R_4$ traveling from the second surface 212 upward to the transparent substrate 210 leaves the light-emitting device 200 through the exposed portion, "A", without passing through the light-emitting layer 243, hence the brightness is increased.

In another exemplary embodiment of FIG. 2B, the area of the second surface 212 is larger than that of the light-emitting layer 243. As shown in the FIG. 2B, the area of the second surface 212 is greater than that of the first surface 211. More specifically, the cross-section of the transparent substrate 210 is like a trapezoid. This structure can increase the brightness of the light-emitting device 200, because the incident angle $\theta_2$ of the light $R_5$ traveling from the second surface 212 to a side 213 of the transparent substrate 210 is smaller than the critical angle $\theta_c$. In detail, α shown in FIG. 2B is the angle that the side 213 tilts to the multi-layer epitaxial structure 240. The angle, "α", changes the incident angle of the light $R_5$ from $\theta_1$ in FIG. 1B to $\theta_2$ (namely $\theta_2=\theta_1-\alpha$), and makes it smaller the critical angle $\theta_c$. Consequently, the light $R_5$ leaves the transparent substrate 210 through the side 213, rather than be reflected back into the multi-layer epitaxial structure 240. Those who are skilled in the art should understand that the critical angle $\theta_c$ mentioned above depends on the material of the transparent substrate 210 and the environmental medium. Therefore, if the environmental medium is set, $\theta_c$ can be determined by choosing an suitable transparent substrate 210, and the tilt angle, "α" is adjusted by changing the ratio of the area of the second surface 212 to the area of the first surface 211 of the transparent substrate 210. Taking the transparent sapphire substrate 210 for example, the ratio of the area of the second surface 212 to that of the first surface 211 is not less than 1.6, and preferably ranges between 4 and 20. The thickness of the transparent substrate 210 is preferably between 50 to 200 microns, more preferably between 80 to 150 microns.

In a further exemplary embodiment of FIG. 2C, the area of the second surface 212 is larger than that of the light-emitting layer 243. In this embodiment, the second surface 212 is larger than the first surface 211, and the first surface 211 has an exposed portion, "A". The ratio of the second surface 212 to the first surface 211 and the ratio of the second surface 212 to the light-emitting layer 243 are similar to those mentioned above.

Additionally, the light-emitting device 200 may further include a reflective layer 280 on the second surface 212 of the transparent substrate 210 in view of demand. The reflective layer 280 shown in FIGS. 2A-2C is, but not limited to, attached directly to the second surface 212. The reflective layer 280 can be made of a material including but not limited to Sn, Al, Au, Pt, An, Ge, Ag and the like. The reflective layer 280 can also be a distributed Bragg reflector (DBR) consisting of oxides, and the oxides can be $Al_2O_3$, $SiO_2$, or $TiO_2$.

FIGS. 3-7 show preferred embodiments of forming the light emitting devices according to the present invention.

Figure 3:
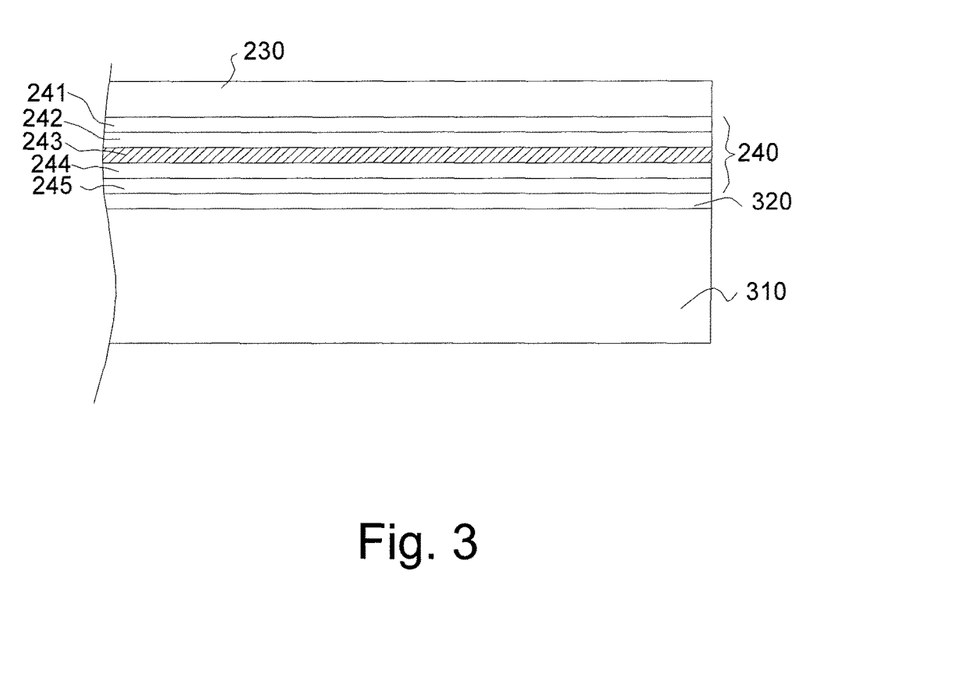
FIGS. 3-6 are schematic diagrams showing the steps of forming a light emitting devices according to the present invention.

As shown in FIG. 3, a temporary substrate 310 is provided, and a multi-layer epitaxial structure 240 is formed on the temporary substrate 310. The steps of forming the multi-layer epitaxial structure 240 includes sequentially forming a second contact layer 245, a second confinement layer 244, a light-emitting layer 243, a first confinement layer 242, and a first contact layer 241 on the temporary substrate 310. Then a first transparent conductive layer 230 covering the multi-layer epitaxial structure 240 is formed. As shown in FIG. 3, an etch stop layer 320 is provided between the multi-layer epitaxial structure 240 and temporary substrate 310 to prevent the multi-layer epitaxial structure 240 from damages caused by over etching in subsequent removal of the temporary substrate 310. Preferably, the etch stop layer 320 has an etching rate lower than that of the temporary substrate 310.

Figure 4:
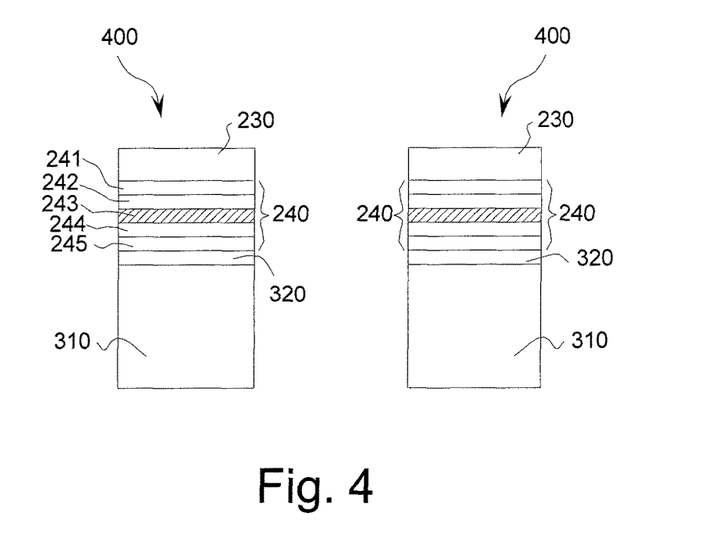

After forming the multi-layer epitaxial structure 240 and the first transparent conductive layer 230 on the temporary substrate 310, the temporary substrate 310 is cut to form a plurality of first dices 400. As shown in FIG. 4, the first dice 400 includes a portion of the multi-layer epitaxial structure 240, a portion of the first transparent conductive layer 230, and a portion of the temporary substrate 310. The cutting step can be performed by use of a diamond tool or a laser tool.

Figure 5:
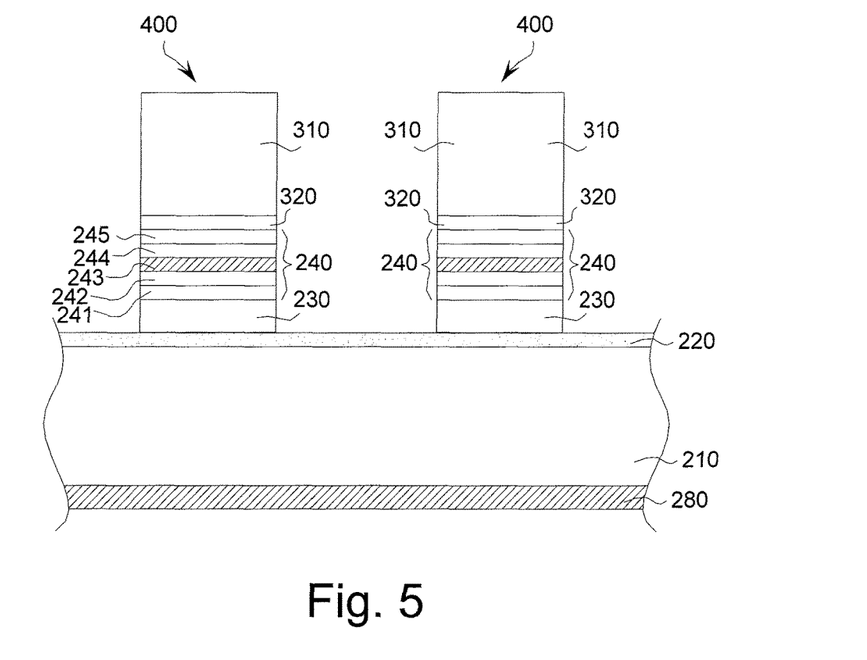

Then, as shown in FIG. 5, the first dice 400 is attached to the transparent substrate 210. A transparent adhesive layer 220 is formed in advance on the first surface 211 of the transparent substrate 210 for bonding the first dice 400 to the transparent substrate 210. Moreover, a reflective layer 280 may be optionally disposed on the second surface 212 of the transparent substrate 210. The material of the reflective layer 280 is similar to those mentioned above.

Figure 6:
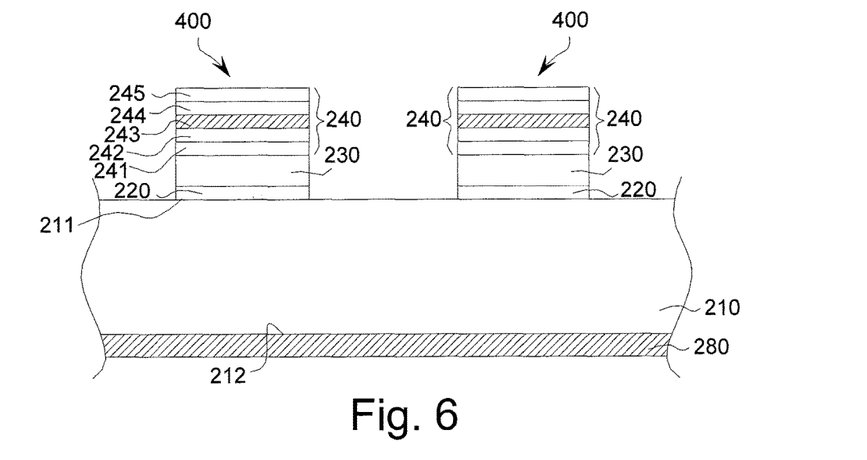

Subsequently, as shown in FIG. 6, the surplus transparent adhesive layer 220 exposed on the transparent substrate 210 is removed, and the temporary substrate 310 is then removed. If the temporary substrate 310 is made of GaAs, it can be removed by a chemical etchant solution such as $5H_3PO_3:3H_2O_2:3H_2O$ or $NH_4OH:35H_2O_2$. After removing the temporary substrate 310, the etch stop layer 320 is further removed.

Figure 7A:
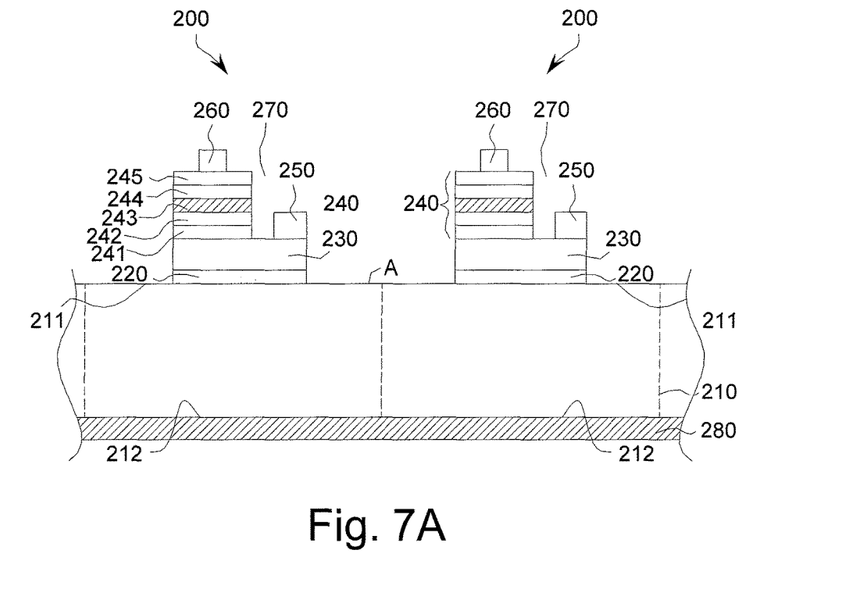
FIGS. 7A-7C are schematic diagrams showing different cutting methods implemented in the present invention.
Figure 7B:
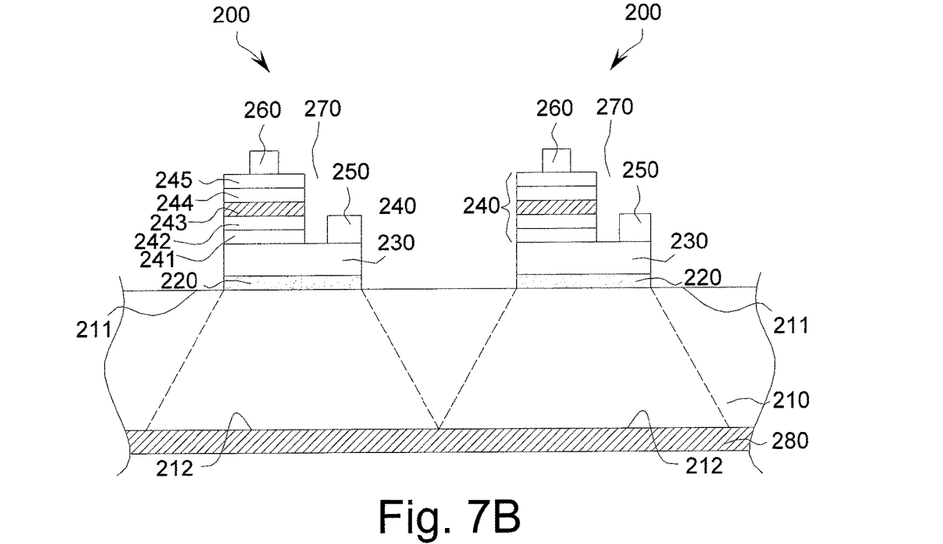
Figure 7C:
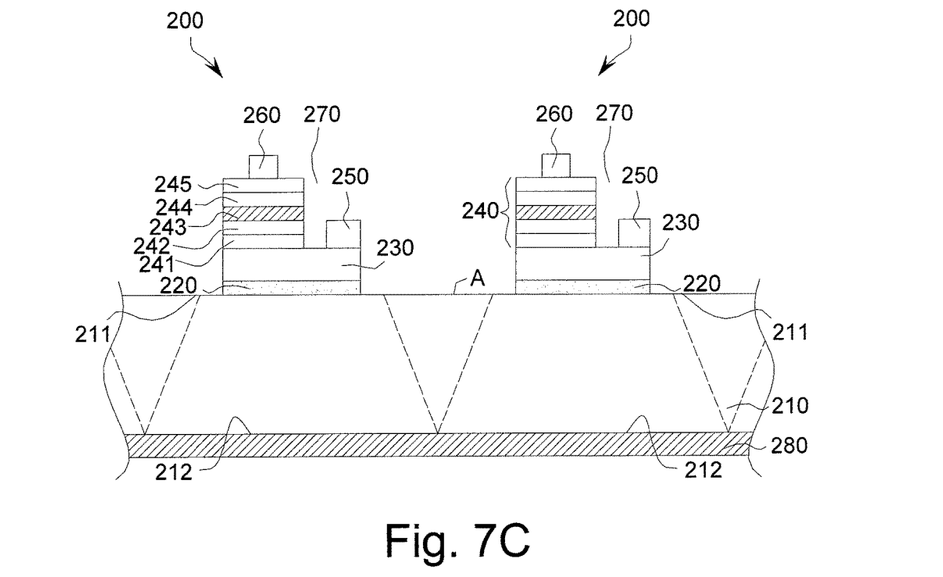

Then, structures as shown in FIGS. 7A-7C can be formed by conventional processes, such as deposition, lithography and etching. In detail, the multi-layer epitaxial structure 240 is selectively etched to expose the underlying first transparent conductive layer 230. Subsequently, a trench 270 as shown in FIGS. 7A-7C is formed, a first electrode 250 is formed on the first transparent conductive layer 230, and a second electrode 260 is formed on the multi-layer epitaxial structure 240. The trench 270 isolates the multi-layer epitaxial structure 240 from the first electrode 250. The first electrode 250 and the second electrode 260 are formed on the same side of the transparent substrate 210. Additionally, a second transparent conductive layer 261 capable of spreading currents may be optionally formed between the second electrode 260 and the second contact layer 245. The second transparent conductive layer 261 forms a good ohmic contact with the second electrode 260. The second transparent conductive layer 261 can be made of a material of the first transparent conductive layer 230 as mentioned above.

Next, the transparent substrate 210 is cut to form a plurality of second dice 200 (namely the light-emitting devices 200). The dotted lines in FIGS. 7A-7C respectively illustrate different cutting manners for obtaining the light-emitting devices 200 shown in FIGS. 2A-2C. After cutting, the second dice 200 includes the first dice 400, a portion of the transparent adhesive layer 220, and a portion of the transparent substrate 210. During cutting, it should be noticed that, the transparent substrate 210 of thus formed second dice 200 has a first surface 211 contacting with the transparent adhesive layer 220 and a second surface 212 opposite to the first surface 211, and the area of the second surface 212 is larger than that of the light-emitting layer 243. The cutting manner of FIG. 7A exposes a portion, "A", of the transparent substrate 210 of the second dice 200. The cutting manner of FIG. 7B makes the second surface 212 of the transparent substrate 210 of the second dice 200 be larger than the first surface 211 without the portion, "A". The cutting manner of FIG. 7C creates the feature that the second surface 212 of the transparent substrate 210 of the second dice 200 is larger than the first surface 211 with the portion, "A". The cutting can be performed by wafer dicing equipments with a diamond tool or a laser tool. To reduce the heat produced by cutting and take away the debris, water with a constant amount at a given pressure may be laterally introduced along the rotating direction of the diamond tool during the cutting step.

The detailed description of the above preferred embodiments is to describe the features and spirit of the present invention more clearly, and is not intended to limit the scope of the present invention. The scope of the present invention should be most broadly explained according to the foregoing description and includes all possible variations and equivalents.

We claim:

1. A light-emitting device, comprising:
   an epitaxial structure comprising an active layer;
   a transparent substrate having a top surface being not less than 1.6 times an area of the active layer;
   a first transparent layer, directly connected to the transparent substrate and comprising a widest width smaller than that of the transparent substrate and larger than that of the epitaxial structure;
   a second transparent layer, made of oxygen and only one metallic element, arranged between the first transparent layer and the epitaxial structure; and
   a first electrode arranged on the first transparent layer and the second transparent layer which are not covered by the active layer,
   wherein the second transparent layer and the transparent substrate have outmost sidewalls which are not coplanar with each other.

2. The light-emitting device of claim 1, wherein the transparent substrate comprises an inclined side surface.

3. The light-emitting device of claim 1, wherein the transparent substrate has a bottom surface being not less than 1.6 times the area of the active layer.

4. The light-emitting device of claim 3, wherein the top surface and the bottom surface have different widths.

5. The light-emitting device of claim 3, wherein the top surface and the bottom surface substantially have the same width.

6. The light-emitting device of claim 1, wherein the active layer is narrower than the second transparent layer.

7. The light-emitting device of claim 1, wherein the epitaxial structure is devoid of a substrate which is used to form the epitaxial structure.

8. The light-emitting device of claim 1, wherein the first electrode is directly connected to the second transparent layer.

9. The light-emitting device of claim 1, wherein the transparent substrate is made of a non-semiconductor material.

10. The light-emitting device of claim 1, wherein the second transparent layer comprises a metal oxide.

11. The light-emitting device of claim 1, wherein the first transparent layer has a thickness is smaller than that of the second transparent layer.

12. The light-emitting device of claim 1, wherein the first electrode is separated from the active layer.

13. The light-emitting device of claim 1, further comprising a second electrode arranged on the epitaxial structure.

14. The light-emitting device of claim 1, further comprising a reflective layer associated with the transparent substrate and has a width greater than the epitaxial structure.

15. The light-emitting device of claim 14, wherein the reflective layer is a distributed Bragg reflector (DBR).

16. The light-emitting device of claim 1, further comprising a reflective layer arranged under the active layer.

17. The light-emitting device of claim 1, wherein the transparent substrate has a thickness between 50 to 200 microns.

* * * * *